United States Patent

[11] 3,633,119

[72] Inventor Michael S. Balbes
Rockville, Md.
[21] Appl. No. 887,945
[22] Filed Dec. 24, 1969
[45] Patented Jan. 4, 1972
[73] Assignee Microdyne Corporation
Rockville, Md.

[54] INTERMEDIATE-FREQUENCY AMPLIFIER WITH WIDE-RANGE CONTINUOUSLY VARIABLE BANDWIDTH SELECTION
5 Claims, 4 Drawing Figs.

[52] U.S. Cl. .................................................... 330/21, 330/29, 330/35, 330/145, 330/154, 330/176, 333/70 R
[51] Int. Cl. .................................................... H03f 3/16
[50] Field of Search ........................................ 330/21, 29, 31, 145, 154, 176, 35; 333/70 R; 307/320; 334/15

[56] References Cited

UNITED STATES PATENTS

| | | | |
|---|---|---|---|
| 2,052,703 | 9/1936 | Farnham ...................... | 333/70 |
| 3,135,934 | 6/1964 | Schoenike .................... | 307/320 X |
| 3,192,491 | 6/1965 | Hesselberth et al. ......... | 334/15 X |
| 3,368,157 | 2/1968 | Fumea et al. ................. | 330/154 X |

OTHER REFERENCES

Schaffner, " Put The Varactor' s Inductance to Use" Electronic Design 21, Oct. 11, 1967 PP. 78- 82

*Primary Examiner*—Roy Lake
*Assistant Examiner*—James B. Mullins
*Attorney*—Homer R. Montague

ABSTRACT: A multistage intermediate-frequency amplifier whose bandwidth, loading and gain-bandwidth product are controlled electronically. Interstage coupling filters utilize varactors in a circuit which allows the bandwidth to be varied by control of a single control voltage, while maintaining the center frequency of the band at a constant predetermined value. Related semiconductor circuits automatically control the coupling, shape-factor and band-pass symmetry to optimum values for the selected bandwidth, as by varying the coupling coefficients and amplifier load impedances from the same control voltage.

Michael S. Balbes,
INVENTOR

BY Homer R. Montague
ATTORNEY

INVENTOR:
M.S. Balbes

BY
Homer R. Montague
ATTORNEY

INTERMEDIATE-FREQUENCY AMPLIFIER WITH WIDE-RANGE CONTINUOUSLY VARIABLE BANDWIDTH SELECTION

BACKGROUND OF THE INVENTION

It is a relatively simple matter to construct a multistage IF amplifier having a fixed bandwidth utilizing fixed value components, but for many purposes, it is required that the bandwidth be selectable or variable over a considerable range. The number of component values which have to be altered in order to maintain optimum alignment, a desired gain-bandwidth product, and proper shape factors, becomes very large, and increases in proportion to the number of stages required. It has usually been the practice in such cases to provide separate complete IF amplifiers and switch them into the receiver circuitry as needed, but this involves considerable cost as well as size and weight sacrifices and the complexity of the switching gear. In telemetry work, especially, the need for a considerable selection of different bandwidths, with precise and rapid programming of the selection process, either under manual or computer control, has not been satisfied by prior efforts of the art.

SUMMARY OF THE INVENTION

The invention provides a solution to the above problem by means of a variable-bandwidth multistage IF amplifier all of whose significant parameters are varied concomitantly by purely electronic means in the amount needed to select the desired bandwidth, maintain the center frequency at the specified value, provide an optimum shape factor and bandpass symmetry, and otherwise conform to optimum design specifications. The accomplishment of these aims of course involves an automatic adjustment of the gain of the amplifier to maintain the desired constant gain-bandwidth product; in addition, in the case of an amplifier having automatic gain control, the invention provides the necessary action to maintain amplifier response characteristics despite gain changes from this source.

More particularly, the amplifier of the invention utilizes interstage coupling networks employing a T-network having a varactor (voltage-varied capacitance diode) in each of its series legs and a similar varactor, oppositely poled, in its shunt leg. A control voltage applied to the junction point raises the effective capacitances of the series legs, with decreasing control voltage, and the series-leg diode is so biased that the same decrease in control voltage lowers the shunt capacitance. In addition, an inductance is connected in series with the shunt-leg varactor, to amplify the change in its capacitance value with respect to changes in the control voltage. The primary and secondary tuned circuits of the coupling stage are further shunted by respective additional varactors subject to the same control voltage as modified by a diode shaping circuit that controls the rate of change of the effect of these varactors with respect to the rate of change of the effective coupling capacitance of the network as a whole. Finally, for control of the shape of the passband, the effective load impedance presented by the coupling network is automatically regulated, under the control of the same control voltage, by a combination of junction transistors and a field-effect transistor. Provisions are incorporated so that the magnitudes of all of these control effects, and the rate at which they operate, as well as their threshhold or action-initiating levels, can be selected in accordance with the application in hand, the number of stages required, etc.

DESCRIPTION OF THE PREFERRED EMBODIMENT

Figure 1:
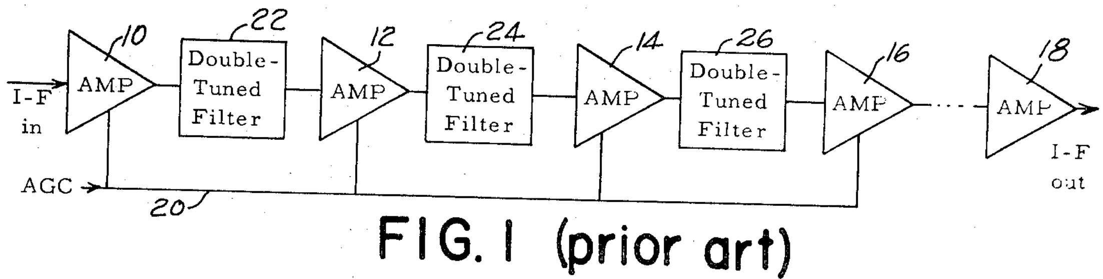
FIG. 1 (prior art)
FIG. 1 is a block diagram of a conventional multistage IF amplifier.

FIG. 1 shows a typical multistage IF amplifier comprising individual amplifier stages 10, 12, 14, 16 and 18, for example, the number of these being chosen in accordance with the necessity to attain the desired overall gain while insuring the optimum shape factor. The amplifier stages are conventionally coupled by double-tuned coupling networks (tuned primary, tuned secondary) such as indicated at 22, 24, and 26. A common automatic gain-control for the amplifier stages may be provided, as at 20.

Figure 2:
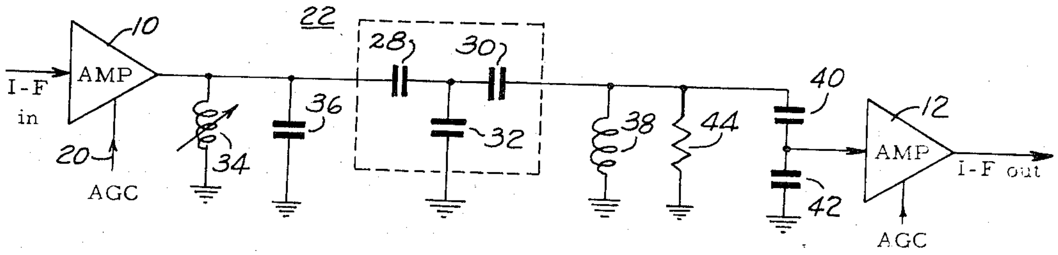
FIG. 2 (prior art)
FIG. 2 is a schematic diagram of the essentials of a conventional interstage coupling network as employed in an amplifier of the FIG. 1 type.

FIG. 2 shows in more detail the coupling arrangement between typical amplifier stages 10 and 12. The double-tuned filter 22 may comprise a T-network having in its series-legs capacitors 28 and 30, and a capacitor 32 in the shunt leg, these being typically fixed ceramic capacitors. The input to the coupling filter may be tuned to the desired center frequency by a variable inductance 34 and capacitor 36, and its output is tuned by the inductor 38 and capacitors 40 and 42, while resistor 44 provides a suitable load resistance. Capacitors 40 and 42 also provide control of the impedance match into the following amplifier stage 12. It is clear that readjustment of the bandwidth even of this limited segment of a multistage amplifier, while maintaining the center frequency and shape factor at optimum, would involve a prohibitive number of adjustments, if frequent or rapidly repeated changes are needed.

Figure 3:
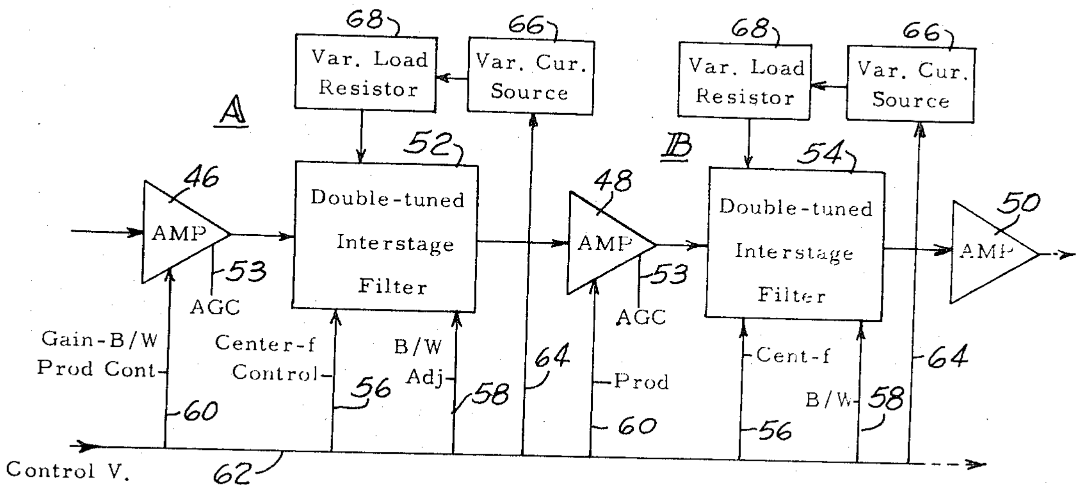
FIG. 3 is a block diagram showing the functions provided by the present invention for two representative stages of an amplifier in accordance with this invention.

FIG. 3 shows in block form the operational aspects of the present invention, as amongst three typical amplifier stages, it being understood that the same arrangement will apply to circuits having more stages. Section A of this diagram refers to the coupling and controls between amplifier 46 and amplifier 48, while section B refers to the same coupling and controls between amplifiers 48 and 50. Section A includes the double-tuned interstage filter 52, while 54 designates the same element for section B, numeral 53 indicating the common AGC controls. Since the parts in these sections are essentially duplicates of one another, only one section need be described. Thus, filter 52 has the center-frequency control 56, necessitated because adjustment of the bandwidth involves an unavoidable amount of center-frequency detuning which must be corrected, for IF amplifier purposes. The adjustment or control for bandwidth is indicated at 58. Numeral 60 indicates a control for the amplifier gain to achieve the desired constancy of the gain-bandwidth product. The control voltages applied to 56, 58 and 60 are preferably derived from a single source of control voltage indicated at 62, common also to all of the stages, as is the control voltage supplied over connection 64 to a variable current source 66 which (in the preferred embodiment being described) is used to regulate the apparent load resistance presented by the filter. The need for this kind of load-resistance control follows from the fact that for each selected bandwidth, there is a proper value of load resistance that is needed to achieve the flat, transitional or "Gaussian" coupling which is found to be the most satisfactory for good phase linearity characteristics. As will appear, the invention utilizes a field-effect transistor to simulate the wide range of load resistances needed, for example, over a 6-to1 ratio, where the range of bandwidths extends, say, from 600 kHz. to 3.6 mHz. The variable load resistance device just described is indicated by numeral 68.

Figure 4:
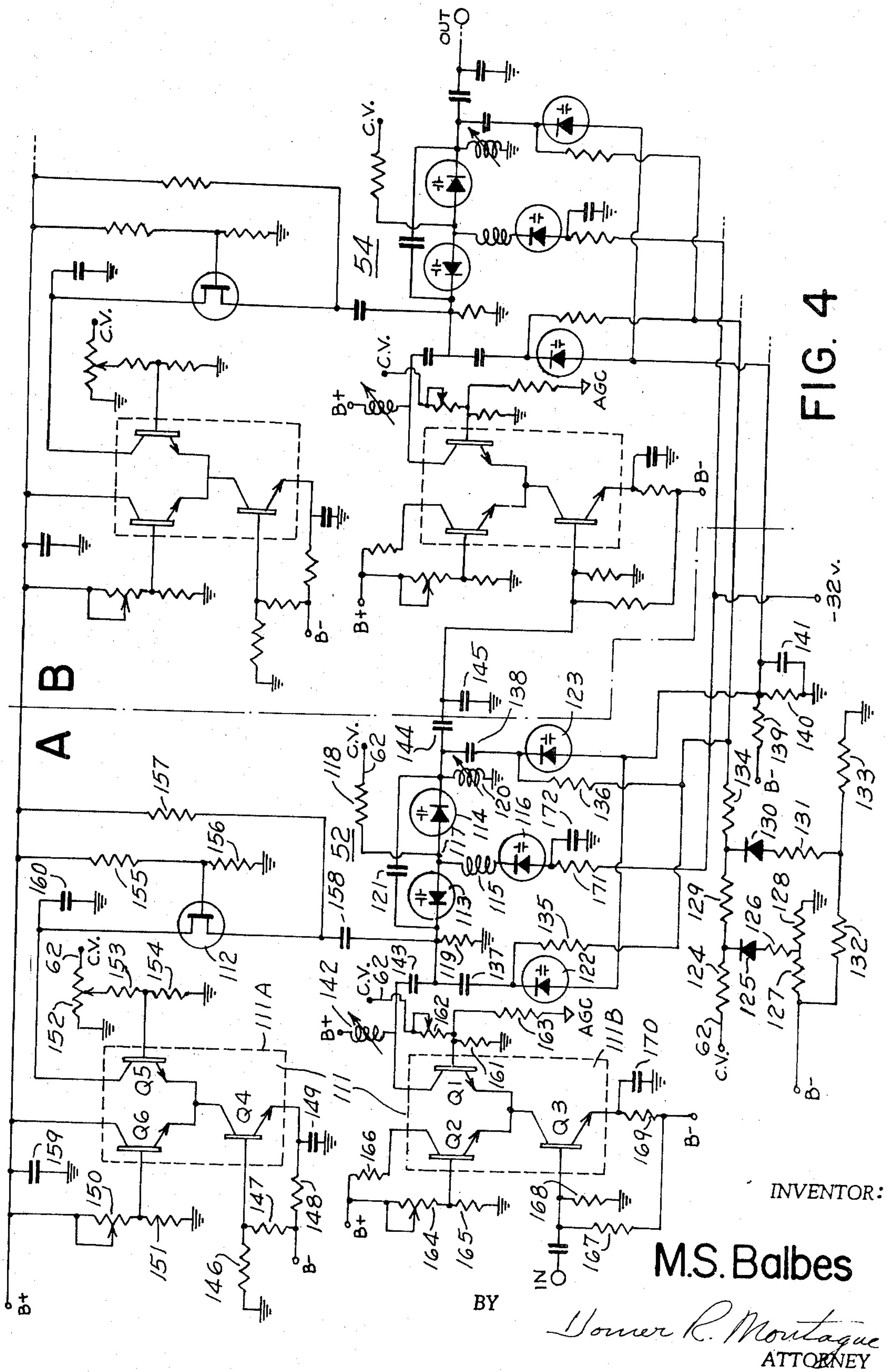
FIG. 4 is a detailed schematic diagram of the circuitry provided by this invention for the stages shown in FIG. 3.

Turning now to the detailed circuit schematic of FIG. 4, the same two major sections A and B of the amplifier are detailed, numerals 52 and 54 again designating as a whole the respective interstage filters. The common source of control voltage is indicated by terminals marked "C. V.," simply to avoid obscuring the diagram with a multiplicity of connections to a single common supply line or bus 62. Similarly, a common source of B+ and B– voltage is represented by those symbols wherever they appear, the polarities indicated being with reference to the usual ground symbols representing either a common grounding bus (or printed circuit pattern), common conductive chassis parts, or the like. As in the case of FIG. 3, a detailed description requires reference only to section A, as it essentially duplicates the arrangements for all sections.

Each stage of FIG. 4 includes an integrated circuit 111 which consists of two independent differential amplifiers with associated constant-current transistors which may be formed on a common monolithic substrate in the usual way for integrated circuit construction. One integrated circuit section, 111A, is utilized in a cascode amplifier configuration with Q3 acting as the common emitter stage and Q1 as the common base stage. Through the constant current source, to be described, power is provided to drive Q1. Q2 and Q1 connected as a differential amplifier, are used to control the gain of the cascode circuit. By controlling the current distribution between Q1 and signal shunt transistor Q2, the effective gain of the circuit is controlled without affecting the input impedance of the stage. This is particularly important so that the band-pass characteristics of the controlled-bandwidth stages are not affected when gain-bandwidth product correction, or AGC are applied to the stage, as described later.

The other integrated circuit section, 111B, is used as a voltage-controlled current source for field-effect transistor 112. This FET is operated as a variable load resistor as described above in relation to 44 in FIG. 2 (and 68 in FIG. 3), and determines the proper damping resistance for any bandwidth that may be set in the controlled-bandwidth stage.

The controlled-bandwidth interstage filter contains two resonant circuits which are capacitively coupled by a T-network configuration. Each arm of the T coupling element, according to an important feature of this invention, is varied simultaneously with the application of a single control voltage. In a typical double-tuned network with capacitive coupling, the coefficient of coupling K must be increased to widen the bandwidth. Furthermore, with T-coupling the coefficient of coupling varies directly with increases in the values of top coupling capacitors 113 and 114 and indirectly with increases in bottom capacitor 116. Consequently, a large change in K and a corresponding bandwidth change may be achieved by varying all three arms of the T simultaneously, the top elements increasing while the bottom one is decreasing, and vice versa.

In the preferred embodiment of this invention, the bottom capacitive element of the T coupling circuit is actually constituted by a series-tuned circuit comprising inductance 115 and voltage-variable capacitor 116. This circuit is made resonant at a frequency higher than the IF amplifier center frequency, so that it appears capacitive at the IF frequency. Any change in the capacitance of diode 116 accordingly represents a much larger change in the apparent capacitive reactance of the bottom leg at the IF frequency. Consequently, a much larger variation in coupling coefficient and bandwidth change is achieved for the same control voltage change in this circuit, as compared to one that utilizes a voltage-variable capacitance diode along in the shunt leg of the T-section.

The control voltage (C. V.) is applied to junction 117 through isolating resistor 118. DC return for diode 113 is provided by resistor 119, and by inductor 120 for diode 114. An increase in control voltage applied to terminal 117 causes a decrease in the capacitance of both diodes 113 and 114. To achieve an important objective of this invention, the capacitance of diode 116 must increase while that of diodes 113 and 114 is decreasing. This means that the voltage across diode 116 must be made to decrease with increasing control voltage. This is accomplished by returning the anode of diode 116 to a fixed voltage (e.g., −32 v.) which is larger that the maximum control voltage value, and of similar polarity, so that when the control voltage is large, the voltage across diode 116 is small, and conversely, when the control voltage is small, diode 116 voltage is large. Thus, the anode of diode 116 is connected to the −32 volt source over isolating resistor 171, which latter is bypassed by capacitor 172.

As the control voltage is changed, the resultant change in opposite directions of diodes 113 and 116 tends to cancel and minimize the effects of capacitance change on the primary resonant circuit. The same holds true for the effects of diodes 114 and 116 on the secondary resonant circuit. The effect of capacitance change in the coupling network is to alter the center frequency to which the IF amplifier is normally tuned, the greatest change being caused by changes in diodes 113 and 114. Thus, if the stage is tuned to the required center frequency when the control voltage is large—at narrow bandwidth—the center frequency of the amplifier tends to shift at low control voltage and wide bandwidth. Capacitor 121 is added across diodes 113 and 114 to restrict the range of these diodes and minimize these effects.

According to another feature of this invention, the effects of coupling change are further reduced to a practical limit by the addition of variable capacitance diodes 122 and 123 across primary and secondary tuned circuits. The control voltage is applied to these diodes through a shaping circuit that controls the rate of change of these diodes with respect to the rate of change of coupling capacitances. The changes in capacitance of diodes 122 and 123 are small but properly controlled over the entire control voltage range so as to hold the center frequency of the tuned IF amplifier practically constant.

To achieve the proper voltage for diodes 122 and 123, the control voltage is applied through isolating resistor 124 to the first shaping circuit diode 125. The degree of shaping is determined by resistor 126 and the voltage at which shaping begins is determined by a potential divider formed by resistors 127 and 128.

The control voltage is then applied through resistor 129 to the second shaping circuit formed by diode 130 and resistor 131. Resistors 132 and 133 form the divider that determines the point at which this diode-shaping begins. The shaped voltage is now applied to voltage-variable capacitance diodes 122 and 123 through isolating resistors 134, 135 and 136. Control diodes 122 and 123 are coupled to the primary and secondary resonant circuits through DC blocking capacitors 137 and 138. The maximum voltage appearing across diodes 123 and 122 is controlled by potential divider 139 and 140 which applies a fixed bias potential to the anodes of control diodes 122 and 123. Capacitor 141 is provided for high-frequency bypassing.

Variable inductors 142 and 120 in conjunction with diodes 122 and 123 determine the center frequency to which the IF amplifier is tuned, and capacitor 143 is used for DC blocking. Capacitors 144 and 145 are provided for proper impedance matching from the tuned interstage circuit to the input of the next stage.

Another important objective of this invention is to control the passband shape. For each bandwidth setting there is a proper value of load resistance for either an undercoupled, overcoupled or transitionally coupled response. This value of load resistance must be directly varied with bandwidth change. In an embodiment of this invention as reduced to practice for a telemetry receiver, the values of the varying load resistor were set to provide a maximally flat to "gaussian"-type response, which is found to be the most satisfactory for good phase linearity characteristics. The range of variable load resistance required depends on the bandwidth range being tuned. In one embodiment of this invention, the bandwidth change was required to be 6:1, e.g., from about 600 kHz. to 3.6 mHz. Load resistance change is directly proportional to bandwidth change, and a varying load change of 6:1 is hence required. Load resistance provided by a field-effect transistor is proportional to the current through the device. Accordingly, the properly varying current through FET 112 is readily provided by the variable current generator 111B and its associated circuitry.

Biasing for constant current generator transistor Q4 is established by bias resistors 146 and 147 and by emitter resistor 148. Capacitor 149 is used for RF bypassing. Current provided by Q4 is split between the differential amplifier pair Q5 and Q6. FET 112 is tied directly to Q5 so that the current in Q5 establishes the FET load resistance. Initial current in Q5 is set by biasing the current shunt transistor Q6 with resistors 150 and 151. Resistor 150 is an adjustable potentiometer, and is used to set the initial operating current of Q5. Current provided by Q5 is varied by the control voltage applied to Q5 through potentiometer 152 and resistors 153 and 154. As the control voltage increases, current through Q5 is decreased. This decrease in current through FET 112 causes a corresponding increase in load resistance, so that the required increase in load resistance with decrease in bandwidth is achieved. The initial operating current of Q5 is set at a maximum bandwidth and minimum control voltage with potentiometer 150. Potentiometer 152 sets the slop of current change, and the proper value required at maximum control voltage and minimum bandwidth. Resistors 155 and 156 fix the gate potential of FET 112, and resistor 157 establishes the B+ line return. The load resistance change provided by FET 112 is coupled to the double-tuned circuit through capacitor 158. Capacitors 159 and 160 are provided for RF bypassing.

The gain of each amplifier stage is directly proportional to the load resistance, so that as the bandwidth is changed the stage gain changes proportionally. A decrease in bandwidth increases the gain, and vice versa. In modern receiver systems it is required to maintain a constant gain-bandwidth product, so that when the bandwidth is increased there must be a corresponding decrease in gain. The gain and bandwidth in accordance with this invention tend to change in the proper direction to satisfy this condition. The exact change in gain of each stage relative to bandwidth will depend upon the number of stages required. An object of this invention is to provide control over the gain of each stage in proper relation to each bandwidth change. This control is achieved by applying the control voltage to the base of Q1 through resistors 161 and 162.

The value of resistor 162 determines the amount of control applied, and it may be adjusted accordingly. With increasing control voltage and without correction, the stage gain tends to increase more rapidly than is required for constant gain-bandwidth product. An increasingly negative voltage on the base of Q1 tends to shift current from Q1 to signal shunt Q2, and decreases the gain of the cascode amplifier formed by Q3 and Q1. The amount of gain change versus bandwidth and control voltage will be determined by the ratio of resistors 162 and 161. The same control voltage can be used to maintain constant gain with changing bandwidth, or other conditions, simply by adjustment of the resistor 162 value. If the stage is to be placed under automatic gain control, as required in a receiving system to change receiver gain with input signal level change, this voltage may be applied through resistor 63, as indicated. An increasingly negative AGC voltage will decrease the stage gain. If the system is to operate from a positive-going AGC voltage, it may be applied to the base of Q2, and again gain will decrease with increase in the AGC voltage. Any change in the operating point of either Q1 or Q2 does not affect the current through Q3, and consequently input impedance remains constant. This ensures that the amplifier response characteristics are maintained despite the action of the gain-bandwidth control and AGC.

Resistors 164 and 165 are used to determine the initial gain operating point of the stage. Resistor 164 is returned to a positive (B+), voltage, and may be adjustable. As the voltage to the base of Q2 is increased in a positive direction, signal is shunted from Q1 to Q2 and the cascode gain is decreased. Resistor 166 also returns to the B+ line. The operating current of current source Q3 is determined by resistors 167, 168 and 169. Capacitor 170 is used to bypass RF from the emitter of Q3. Resistor 171 has the function of isolating diode 116 from the −32 volt source, and capacitor 172 bypasses the anode of 116 to ground for RF voltages.

The scope of this invention is not limited to any particular IF amplifier center-frequency or bandwidth range. In fact, the invention has been successfully reduced to practice at center frequencies of 10 mHz and 160 mHz, and with bandwidth ranges of 600 kHz. to 3.6 mHz and 4 mHz to 40 mHz respectively.

What is claimed is:

1. A varactor-controlled adjustable bandwidth fixed-frequency amplifier comprising a plurality of cascaded amplifier stages and a double-tuned filter connected between each amplifier stage and the succeeding amplifier stage, a. each such filter including a T-network comprising first and second varactors in the respective series legs of the network and a third varactor in the shunt leg thereof, b. a source of adjustable control voltage applied to the junction point of said T-network, c. said first and second varactors being poled relative to said junction point to vary their effective capacitances in one sense relative to changes in said control voltage, and said third varactor being poled relative to said junction point to vary its effective capacitance in the opposite sense relative to changes in said control voltage;

d. said amplifier including an inductance in series with said third varactor, forming therewith a series-resonant circuit having a resonant frequency higher than the design center frequency of said amplifier, to present an amplified value of effective capacitance change in said shunt leg of the T-network;

e. and each such filter including a pair of tuned circuits coupled by said T-network, and fourth and fifth varactors respectively connected in shunting relation to said tuned circuits; and voltage-shaping circuit means connecting said fourth and fifth varactors to said source of control voltage, to hold constant the center frequency of said amplifier for all useful values of said control voltage.

2. An amplifier in accordance with claim 1, including means providing a voltage-controlled load impedance for each of said amplifier stages, and a control current connection from said source of control voltage to said means.

3. An amplifier in accordance with claim 2, in which said voltage-controlled load impedance includes a field-effect transistor.

4. An amplifier in accordance with claim 3, in which said voltage-controlled load impedance includes a voltage-controllable current source.

5. An amplifier in accordance with claim 4, and means for limiting the range of current supplied by said current source.

* * * * *